United States Patent
Kong et al.

(10) Patent No.: US 10,756,309 B2
(45) Date of Patent: Aug. 25, 2020

(54) LIGHT-EMITTING DISPLAY DEVICE

(71) Applicant: SAMSUNG DISPLAY CO., LTD., Yongin-si, Gyeonggi-do (KR)

(72) Inventors: Hyang Shik Kong, Yongin-si (KR); Yoon Ho Kang, Yongin-si (KR); Dong Hoon Kwak, Yongin-si (KR); Sung Woong Kim, Yongin-si (KR); Yool Guk Kim, Yongin-si (KR); Jae Hoon Kim, Yongin-si (KR); Ye Seul Na, Yongin-si (KR); Seok Soon Back, Yongin-si (KR); Jae Kwon Hwang, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 16/400,168

(22) Filed: May 1, 2019

(65) Prior Publication Data
US 2019/0280250 A1    Sep. 12, 2019

Related U.S. Application Data

(62) Division of application No. 14/884,798, filed on Oct. 16, 2015, now Pat. No. 10,312,443.

(30) Foreign Application Priority Data

May 22, 2015  (KR) ........................ 10-2015-0071721

(51) Int. Cl.
*H01L 51/54* (2006.01)
*H01L 51/56* (2006.01)
*H01L 27/32* (2006.01)
*H01L 51/50* (2006.01)

(52) U.S. Cl.
CPC .......... *H01L 51/56* (2013.01); *H01L 27/3246* (2013.01); *H01L 51/5056* (2013.01)

(58) Field of Classification Search
None
See application file for complete search history.

(56) References Cited

U.S. PATENT DOCUMENTS

| 2008/0143251 A1 | 6/2008 | Mathea et al. |
| 2011/0017980 A1 | 1/2011 | Fennimore et al. |

FOREIGN PATENT DOCUMENTS

| KR | 10-2012-0051042 A | 5/2012 |
| KR | 10-2014-0037393 A | 3/2014 |
| KR | 10-2014-0045157 A | 4/2014 |

*Primary Examiner* — Andrew K Bohaty
(74) *Attorney, Agent, or Firm* — F. Chau & Associates, LLC

(57) ABSTRACT

A method of manufacturing a light-emitting display device, the method including forming a first electrode on a substrate, the substrate including a plurality of pixel regions divided by a non-pixel region, in each of the pixel regions; forming a pixel defining layer, the pixel defining layer having a plurality of pixel openings, each of the pixel openings exposing the first electrode, on the substrate; forming a hole injection layer on the first electrode; forming a lyophilic layer on the hole injection layer to completely overlap the hole injection layer; forming a hole transport layer on the lyophilic layer; forming a light-emitting layer on the hole transport layer; and forming a second electrode on the light-emitting layer.

7 Claims, 9 Drawing Sheets

LIGHT-EMITTING DISPLAY DEVICE

CROSS-REFERENCE TO RELATED APPLICATIONS

This is a divisional application based on pending application Ser. No. 14/884,798, filed Oct. 16, 2015, the entire contents of which is hereby incorporated by reference.

Korean Patent Application No. 10-2015-0071721, filed on May 22, 2015, in the Korean Intellectual Property Office, and entitled: "Method of Manufacturing Light-Emitting Display Device and Light-Emitting Display Device Manufactured Using the Method," is incorporated by reference herein in its entirety.

BACKGROUND

1. Field

Embodiments relate to a method of manufacturing a light-emitting display device and a light-emitting display device manufactured using the method.

2. Description of the Related Art

Among light-emitting display devices, organic light-emitting display devices, which may be self-luminous display devices, may provide wide viewing angle, high contrast, and fast response speed.

An organic light-emitting display device may include a light-emitting layer made of an organic light-emitting material between an anode and a cathode. When positive and negative voltages are respectively applied to these electrodes, holes may move from the anode to the light-emitting layer via a hole injection layer and a hole transport layer, and electrons may move from the cathode to the light-emitting layer via an electron injection layer and an electron transport layer. The electrons and the holes may recombine in the light-emitting layer to generate excitons. As the excitons change from an excited state to a ground state, the light-emitting layer may emits light, and an image may be displayed.

SUMMARY

Embodiments may be realized by providing a method of manufacturing a light-emitting display device, the method including forming a first electrode on a substrate, the substrate including a plurality of pixel regions divided by a non-pixel region, in each of the pixel regions; forming a pixel defining layer, the pixel defining layer having a plurality of pixel openings, each of the pixel openings exposing the first electrode, on the substrate; forming a hole injection layer on the first electrode; forming a lyophilic layer on the hole injection layer to completely overlap the hole injection layer by forming a lyophilic material layer, whose portion in contact with the hole injection layer is cured by light, on the hole injection layer, placing an open mask, the open mask including an opening region and a blocking region located outside the opening region, above the pixel defining layer such that the opening region overlaps the pixel regions and the non-pixel region, and irradiating the light to the lyophilic material layer; forming a hole transport layer on the lyophilic layer; forming a light-emitting layer on the hole transport layer; and forming a second electrode on the light-emitting layer.

The lyophilic material layer may include a first portion contacting a surface of the hole injection layer and a second portion contacting a surface of the pixel defining layer.

The lyophilic material layer may be formed using a slit coating method.

Forming the lyophilic layer may further include removing the second portion using a developing solution after irradiating the light to the lyophilic material layer.

An entirety of the lyophilic material layer may contact the hole injection layer within each of the pixel openings of the pixel defining layer.

The lyophilic material layer may be formed using an inkjet printing method or a nozzle printing method.

The lyophilic material layer may include one or more of olefin, acrylate, methacrylate, vinyl ether, quinone, benzophenone, benzoin ether, aryl ketone, peroxide, biimidazole, benzyl dimethyl ketal, hydroxyl alkyl phenyl acetophone, dialkoxy actophenone, trimethylbenzoyl phosphine oxide derivatives, aminoketone, benzoyl cyclohexanol, methyl thiophenyl morpholino ketone, morpholino phenyl amino ketone, alpha halogeno acetophenone, oxysulfonyl ketone, sulfonyl ketone, oxysulfonyl ketone, sulfonyl ketone, benzoyl oxime ester, thioxanthone, camphorquinone, ketocoumarin, or Michler's ketone.

The hole injection layer may include one or more of 4,4',4"-tris(3-methylphenylphenylamino)triphenylamine (MTDATA), copper phthalocyanine (CuPc), polyaniline (PANI), or poly(3,4-ethylenedioxythiophene)/polystyrene sulfonate (PEDOT/PSS).

Forming the hole injection layer may be performed using an inkjet printing method or a nozzle printing method.

Forming the hole transport layer may be performed using an inkjet printing method or a nozzle printing method.

The pixel defining layer may include an insulating material that contains fluorine.

The opening region of the open mask may consist of one opening.

The light may be ultraviolet (UV) light.

Embodiments may be realized by providing light-emitting display device, including a substrate including a plurality of pixel regions divided by a non-pixel region; a first electrode on the substrate in each of the pixel regions; a pixel defining layer on the substrate and including a plurality of pixel openings, each of the pixel openings exposing the first electrode; a hole injection layer on the first electrode in each of the pixel openings; a lyophilic layer on the hole injection layer, the lyophilic layer completely overlapping the hole injection layer and including a material whose portion in contact with the hole injection layer reacts to light; a hole transport layer on the lyophilic layer; a light-emitting layer on the hole transport layer; and a second electrode on the light-emitting layer The lyophilic layer may be in each of the pixel openings The lyophilic layer may be formed in a same pattern as the hole injection layer.

The lyophilic layer may include one or more of olefin, acrylate, methacrylate, vinyl ether, quinone, benzophenone, benzoin ether, aryl ketone, peroxide, biimidazole, benzyl dimethyl ketal, hydroxyl alkyl phenyl acetophone, dialkoxy actophenone, trimethylbenzoyl phosphine oxide derivatives, aminoketone, benzoyl cyclohexanol, methyl thiophenyl morpholino ketone, morpholino phenyl amino ketone, alpha halogeno acetophenone, oxysulfonyl ketone, sulfonyl ketone, oxysulfonyl ketone, sulfonyl ketone, benzoyl oxime ester, thioxanthone, camphorquinone, ketocoumarin, or Michler's ketone.

The hole injection layer may include one or more of 4,4',4"-tris(3-methylphenylphenylamino)triphenylamine (MTDATA), copper phthalocyanine (CuPc), polyaniline (PANI), or poly(3,4-ethylenedioxythiophene)/polystyrene sulfonate (PEDOT/PSS).

The pixel defining layer may include an insulating material that contains fluorine.

The light-emitting display device may further include one or more of an electron transport layer or an electron injection layer between the light-emitting layer and the second electrode.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
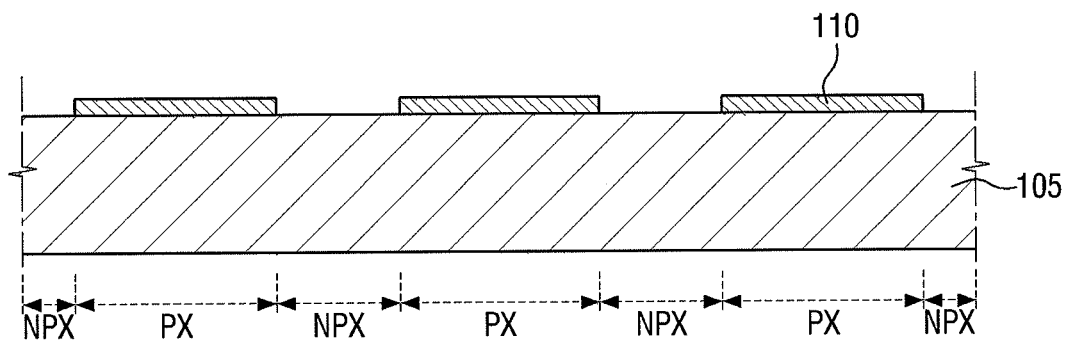
FIGS. 1 through 13 illustrate cross-sectional views of operations of a method of manufacturing a light-emitting display device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section.

FIGS. 1 through 13 illustrate cross-sectional views of operations of a method of manufacturing a light-emitting display device according to an embodiment.

Referring to FIG. 1, a substrate 105 may include a plurality of pixel regions PX divided by a non-pixel region NPX. A first electrode 110 may be formed on the substrate 105 in each pixel region PX.

The substrate 105 may include an insulating substrate. The insulating substrate may be made of a transparent glass material containing $SiO_2$ as its main component. In some embodiments, the insulating substrate may be made of an opaque material or a plastic material. Further, the insulating substrate may be a flexible substrate.

The substrate 105 may further include other structures formed on the insulating substrate. Examples of the structures include wirings, electrodes, and insulating layers. In some embodiments, the substrate 105 may include a plurality of thin-film transistors (TFTs) formed on the insulating substrate. Each of at least some of the TFTs may have a drain electrode electrically connected to the first electrode 110. Each of the TFTs may include an active region made of amorphous silicon, polycrystalline silicon or monocrystalline silicon. In an embodiment, each of the TFTs may include an active region made of an oxide semiconductor.

The pixel regions PX of the substrate 105 may be arranged in a matrix. The pixel regions PX may be regions where light is substantially visible and may be light-emitting regions. In some embodiments, the pixel regions PX may include a red pixel region which may emit red light, a green pixel region which may emit green light, and a blue pixel region which may emit blue light.

The non-pixel region may divide the pixel regions PX. The non-pixel region NPX may be a region where light is not visible and may be a non-light-emitting region. Accordingly, the non-pixel region NPX may not include a light-emitting structure for light emission. In some embodiments, the non-light-emitting region may include a light-emitting structure in at least part thereof and may be a region where light emission is blocked by a light-blocking structure.

Figure 13:
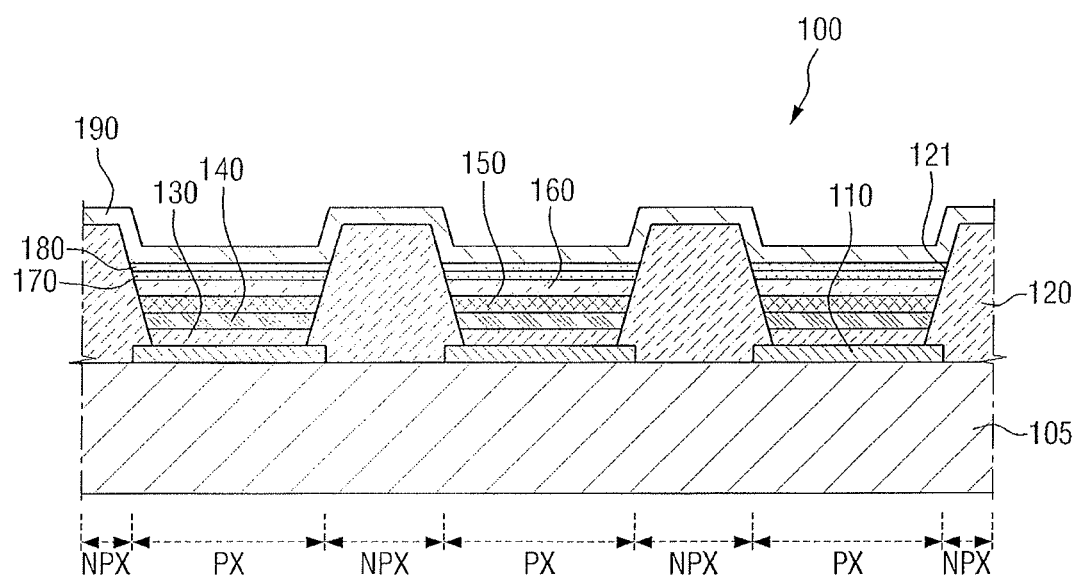

The pixel regions PX and the non-pixel region NPX may be included in a display area of a light-emitting display device 100 (see FIG. 13). The display area may be where an image is displayed, and a non-display area where no image is displayed may be disposed around the display area. Various circuit units for driving the light-emitting display device 100 (see FIG. 13) may be included in the non-display area.

The first electrode 110 may be formed by depositing and patterning a conductive material or a reflective material on the substrate 105.

The first electrode 110 may include a conductive material having a relatively higher work function than a second electrode 190 (see FIG. 13). Examples of the conductive material include indium tin oxide (ITO), indium zinc oxide (IZO), zinc oxide (ZnO), and indium oxide ($In_2O_3$). These example conductive materials have relatively high work functions and transparent properties, and if the light-emitting display device 100 (see FIG. 13) is of a bottom emission type or a dual emission type, the first electrode 110 may be formed as a conductive layer containing at least one of the above conductive materials or a stacked layer of the above conductive materials.

If the light-emitting display device 100 (see FIG. 13) is of a top emission type, the first electrode 110 may further include a reflective material together the above conductive materials. Examples of the reflective material include silver (Ag), magnesium (Mg), aluminum (Al), platinum (Pt), lead (Pd), gold (Au), nickel (Ni), neodymium (Nd), iridium (Ir), chrome (Cr), lithium (Li), calcium (Ca), and mixtures thereof. Therefore, the first electrode 110 may be have a monolayer structure composed of at least one of the above conductive and reflective materials or a multilayer structure composed of a stack of the above conductive and reflective materials. If the first electrode 110 has a multilayer structure, a topmost layer adjacent to a hole injection layer 130 (see FIG. 13) may be made of a conductive material having a high work function. For example, the first electrode 110 may have a multilayer structure such as, for example, ITO/Mg, ITO/MgF, ITO/Ag, or ITO/Ag/ITO.

Figure 2:
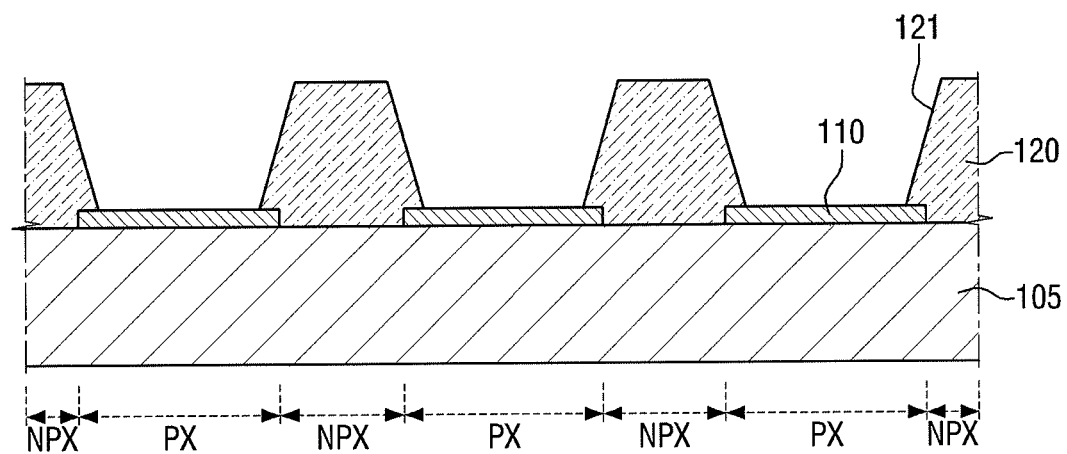

Referring to FIG. 2, a pixel defining layer 120 may be formed on the substrate 105. The pixel defining layer 120 may define each pixel region PX and may have a plurality of pixel openings 121, each exposing the first electrode 110. The pixel defining layer 120 may be formed by depositing an insulating material on the whole surface of the substrate 105 using a deposition method to cover the first electrode 110 and patterning the deposited insulating material.

The pixel defining layer 120 may be formed to have a lyophobic property such that a hole injection solution 130a (see FIG. 3) cannot flow out of the pixel openings 121 of the pixel defining layer 120 when a hole injection layer 130 is formed by ejecting the hole injection solution 130a (see FIG. 3) into the pixel openings 121 of the pixel defining layer 120 using an inkjet printing method or a nozzle printing method. For example, the pixel defining layer 120 may be made of an insulating material that may cause a contact angle of the hole injection solution 130a to the pixel defining layer 120 to be approximately 40 degrees or more. For example, the pixel defining layer 120 may be made of an organic insulating material that contains fluorine. The organic insulating material may include one or more of benzocyclobutene (BCB), polyimide (PI), polyamide (PA), acrylic resin, or phenolic resin. The pixel defining layer 120 may be formed using, for example, a photolithography method. The inkjet printing method may be a method of dropping a solution to be printed onto a desired location in the form of ink droplets. The nozzle printing method may be a method of making a solution to be printed flow along a line including a desired location.

Figure 3:
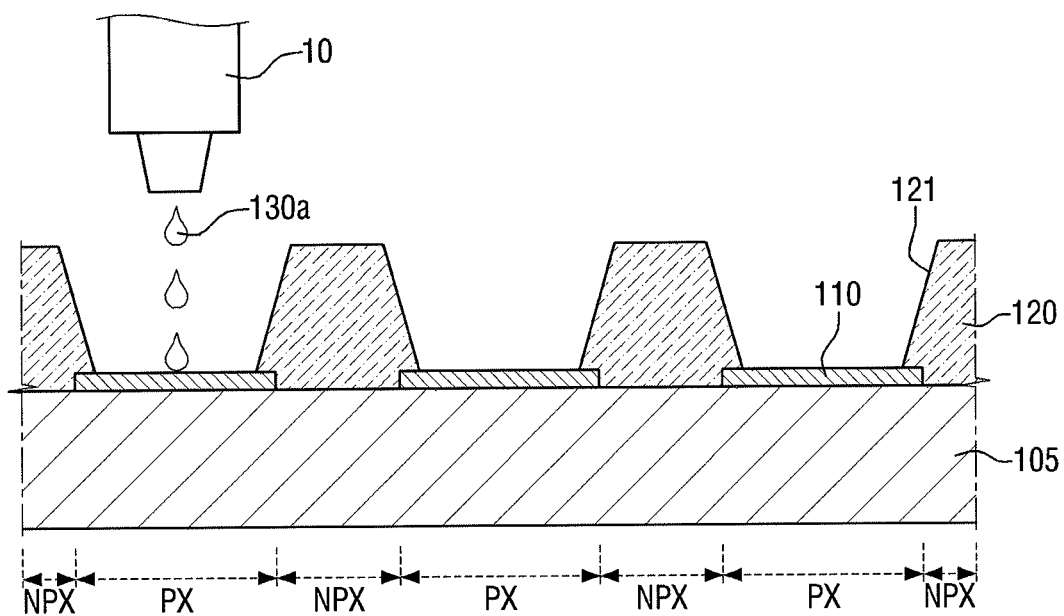
Figure 4:
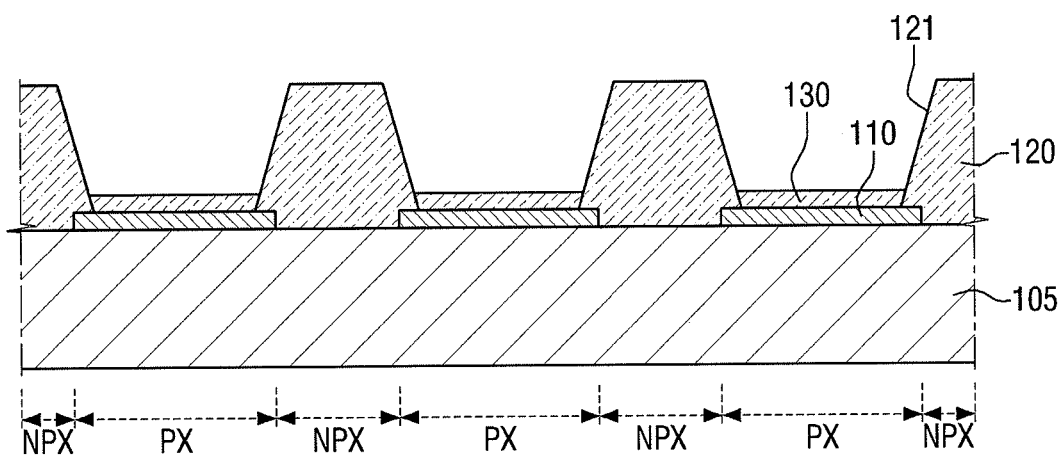

Referring to FIGS. 3 and 4, the hole injection layer 130 may be formed on the first electrode 110.

Rreferring to FIG. 3, the hole injection solution 130a may be ejected from an ejection device 10 into each of the pixel openings 121 of the pixel defining layer 120 using a printing method such as an inkjet printing method and then dried, and the hole injection layer 130 may be formed on the first electrode 110 inside each of the pixel openings 121 of the pixel defining layer 120, as illustrated in FIG. 4. In some embodiments, the hole injection solution 130a may be ejected from the ejection device 10 into each of the pixel openings 121 of the pixel defining layer 120 using a nozzle printing method.

The hole injection layer 130 may include an organic compound such as one or more of, for example, 4,4',4"-tris (3-methylphenylphenylamino)triphenylamine (MTDATA), copper phthalocyanine (CuPc), polyaniline (PANI), or poly (3,4-ethylenedioxythiophene)/polystyrene sulfonate (PEDOT/PSS).

Referring to FIGS. 5 through 8, a lyophilic layer 140 may be formed on the first electrode 110 using an open mask OM.

Figure 5:
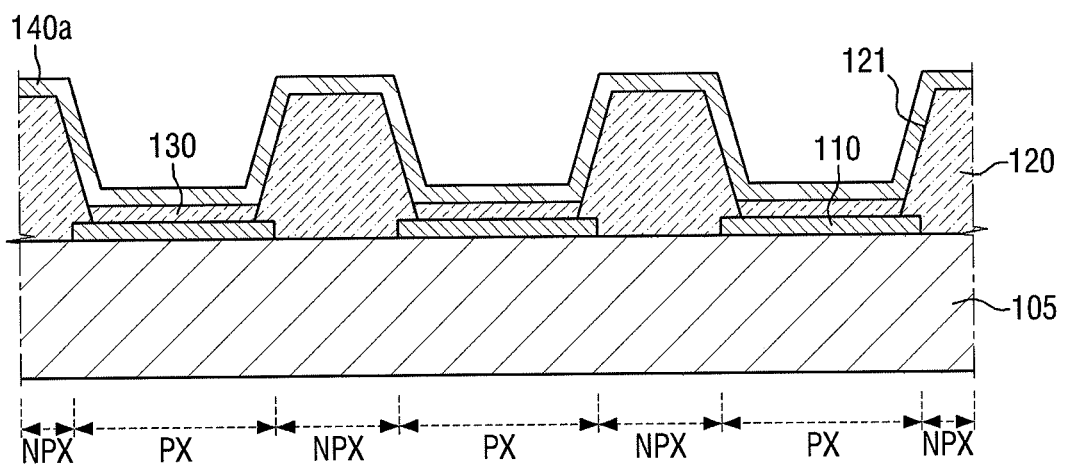

Referring to FIG. 5, a lyophilic material layer 140a may be formed by coating a lyophilic solution not only on the first electrode 110 but also on the whole surface of the pixel defining layer 120 using, e.g., slit coating. The lyophilic material layer 140a may be made of a material whose portion in contact with the hole injection layer 130 is cured by light. The light may be ultraviolet (UV) light.

Figure 6:
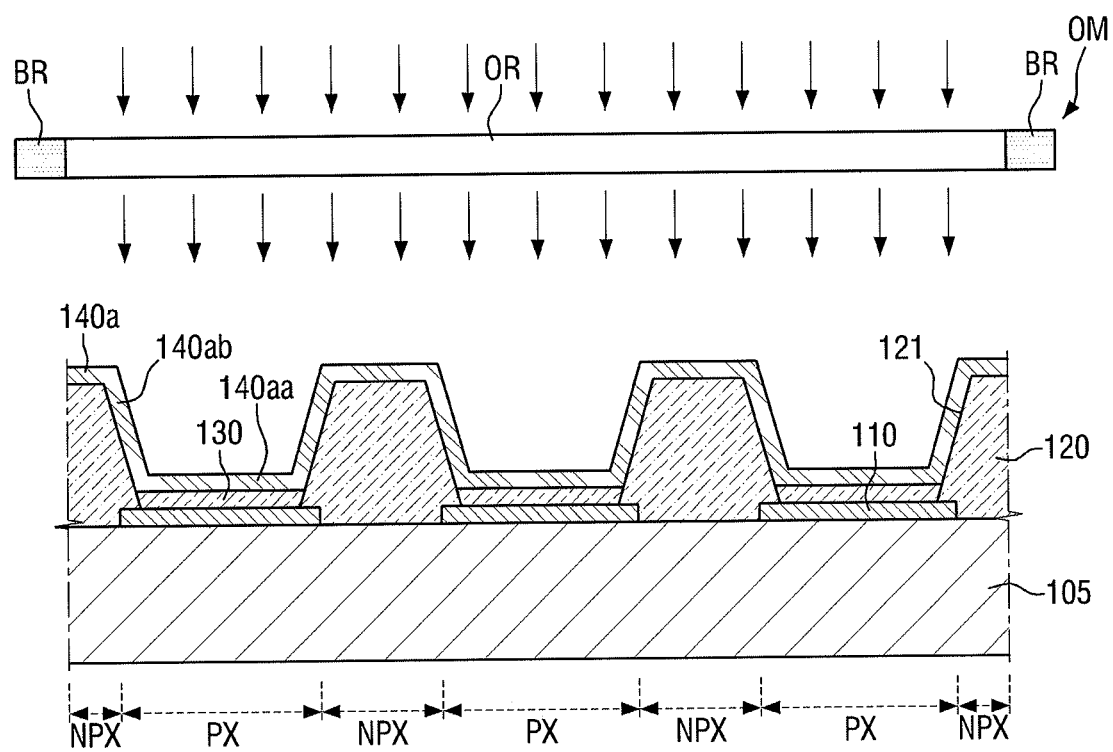

Referring to FIG. 6, the open mask OM may be placed above the pixel defining layer 120 to face the pixel defining layer 120, and then light may be irradiated to the lyophilic material layer 140a. In FIG. 6, arrows indicate light irradiated and passing through the open mask OM.

The open mask OM may include a blocking region BR which may block light and an opening region OR which may allow light to pass therethrough. The blocking region BR may be ring-shaped, and the opening region OR may be an opening and defined by the blocking region BR. For example, the blocking region BR may be located outside the opening region OR. The opening region OR may consist of one opening that is large enough to overlap the pixel regions PX and the non-pixel region NPX.

The open mask OM may be placed above the pixel defining layer 120 such that the opening region OR of the open mask OM may overlap the pixel regions PX and the non-pixel region NPX, and light may be irradiated to the lyophilic material layer 140a. Then, the lyophilic material layer 140a may be exposed to the light. A first portion 140aa of the lyophilic material layer 140a which directly contacts a surface of the hole injection layer 130 may react to the light (e.g., changes at least chemically or physically) and may be cured, whereas a second portion 140ab which does not contact the hole injection layer 130 (e.g., contacts a surface of the pixel defining layer 120) may not react to the light and may have high softening properties. For example, the first portion 140aa may have low solubility, dispersibility, fluidity, mobility, adhesion or absorbency for a developing solution 20a (see FIG. 7), whereas the second portion 140ab may have high solubility, dispersibility, fluidity, mobility, adhesion or absorbency for the developing solution 20a (see FIG. 7).

The lyophilic material layer 140a may include one or more of, for example, olefin, acrylate, methacrylate, vinyl ether, quinone, benzophenone, benzoin ether, aryl ketone, peroxide, biimidazole, benzyl dimethyl ketal, hydroxyl alkyl phenyl acetophone, dialkoxy actophenone, trimethylbenzoyl phosphine oxide derivatives, aminoketone, benzoyl cyclohexanol, methyl thiophenyl morpholino ketone, morpholino phenyl amino ketone, alpha halogeno acetophenone, oxysulfonyl ketone, sulfonyl ketone, oxysulfonyl ketone, sulfonyl ketone, benzoyl oxime ester, thioxanthone, camphorquinone, ketocoumarin, or Michler's ketone.

Figure 7:
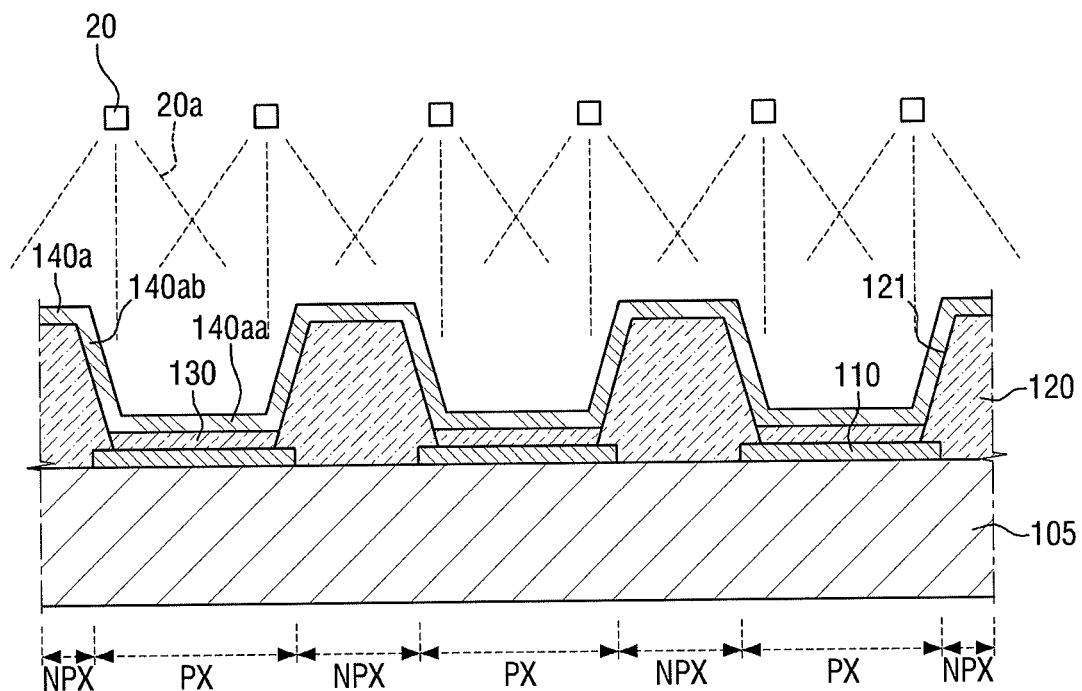
Figure 8:
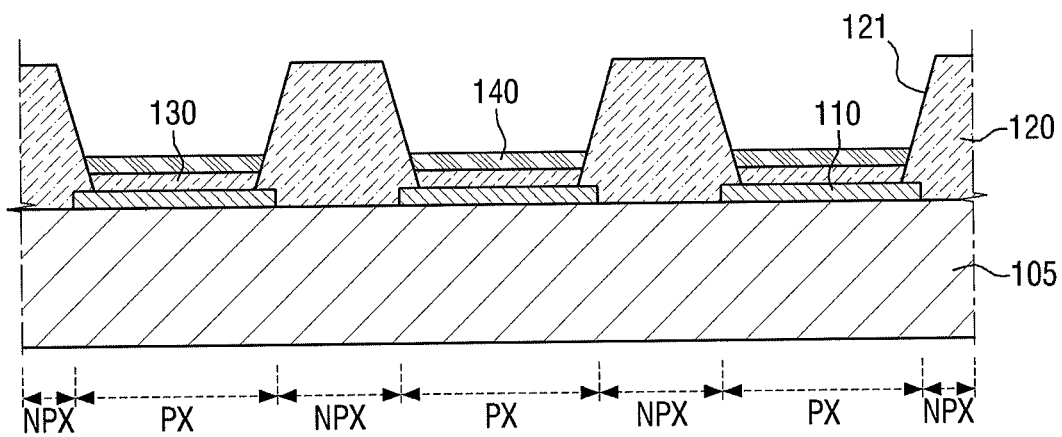

Referring to FIG. 7, the developing solution 20a may be sprayed from a spray device 20 toward the lyophilic material layer 140a, and the second portion 140ab of the lyophilic material layer 140a may be removed, leaving only the first portion 140aa. Accordingly, the lyophilic layer 140 may be formed in each of the pixel openings 121 of the pixel defining layer 120 to completely overlap the hole injection layer 130, as illustrated in FIG. 8.

The lyophilic layer 140 may have a contact angle of approximately 20 degrees or less with respect to a hole transport solution 150a (see FIG. 9), and the hole transport solution 150a (see FIG. 9) may have high wettability for the lyophilic layers 140a. Accordingly, a hole transport layer 150 (see FIG. 10) may be evenly formed on the lyophilic layer 140 inside each of the pixel openings 121 of the pixel defining layer 120.

As described above, even if the whole of the lyophilic material layer 140a is exposed to light, only the first portion 140aa which directly contacts the hole injection layer 130 may react to and may be cured by light, whereas the second portion 140ab which does not contact the hole injection layer 130 may not react to the light and may have softening properties. Accordingly, the developing solution 20a sprayed over the lyophilic material layer 140a may remove the second portion 140ab, leaving only the first portion 140aa, the lyophilic layer 140 may be formed inside each of the pixel openings 121 of the pixel defining layer 120, and there may be no need for a pattern mask having a complicated pattern. Instead, the open mask OM having a simple structure without a pattern may be used to prevent light irradiated to the lyophilic material layer 140a from leaking to unnecessary regions.

The open mask OM may be reused even if a model of a light-emitting display device is changed. Therefore, it may not be necessary to change masks whenever the model of the light-emitting display device is changed, and the entire process may be simplified.

Figure 9:
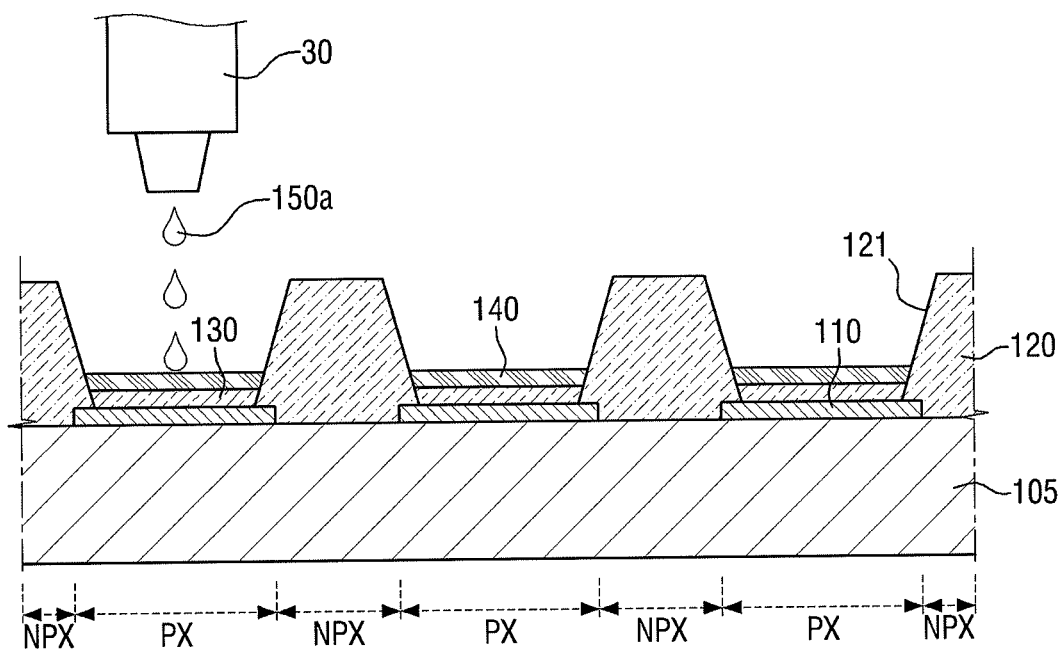
Figure 10:
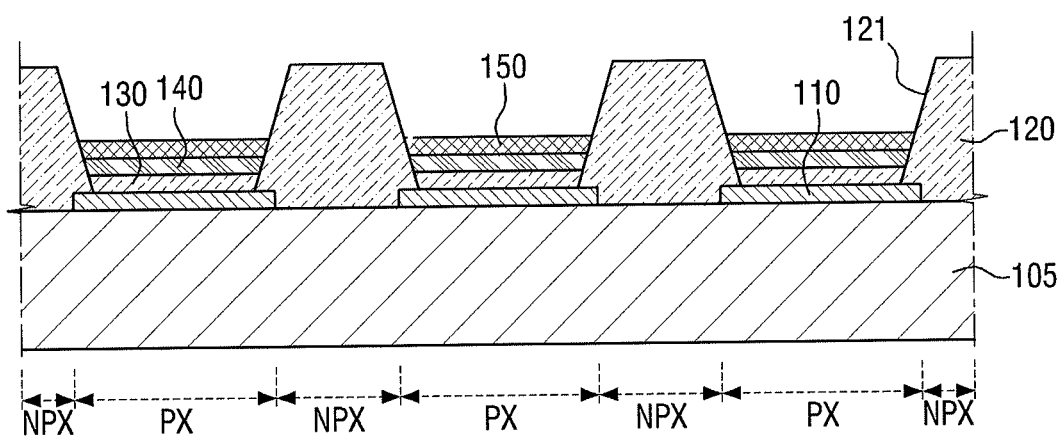

Referring to FIGS. 9 and 10, the hole transport layer 150 may be formed on the lyophilic layer 140.

Referring to FIG. 9, the hole transport solution 150a may be ejected from an ejection device 30 into each of the pixel openings 121 of the pixel defining layer 120 using a printing method such as an inkjet printing method and then dried, and the hole transport layer 150 may be formed on the lyophilic layer 140 inside each of the pixel openings 121 of the pixel defining layer 120, as illustrated in FIG. 10. In some embodiments, the hole transport solution 150a may be ejected from the ejection device 30 into each of the pixel openings 121 of the pixel defining layer 120 using a nozzle printing method.

The hole transport layer 150 may be made of an organic compound such as, for example, N,N'-diphenyl-N,N'-bis(3-methylphenyl)-1,1'-bi-phenyl-4,4'-diamine (TPD) or N,N'-di(naphthalene-1-yl)-N,N-diphenyl-benzidine (NPB).

Figure 11:
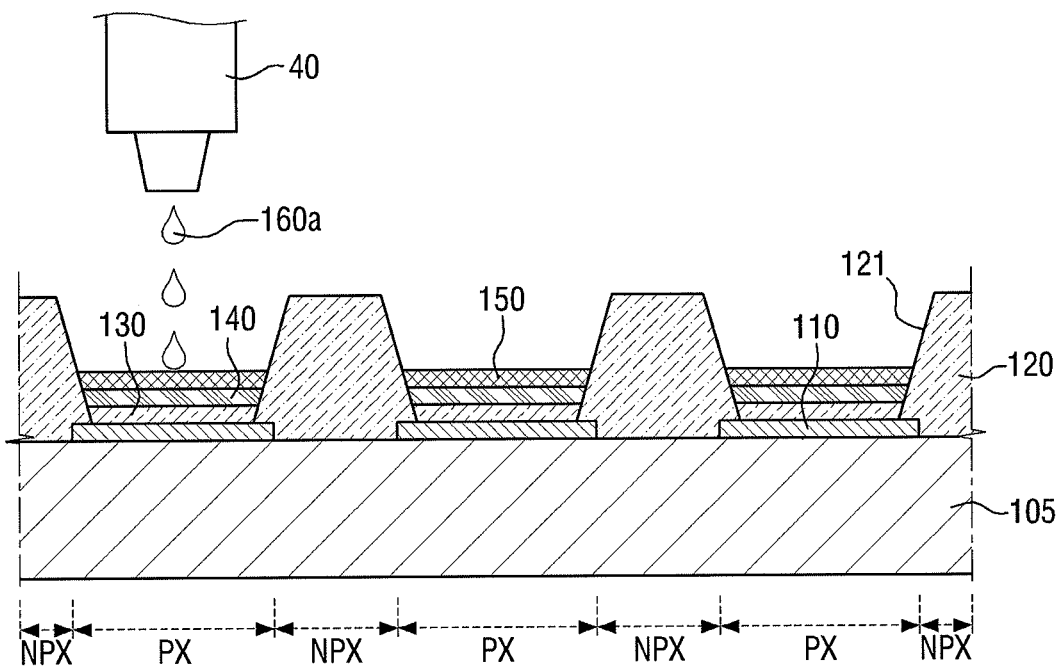
Figure 12:
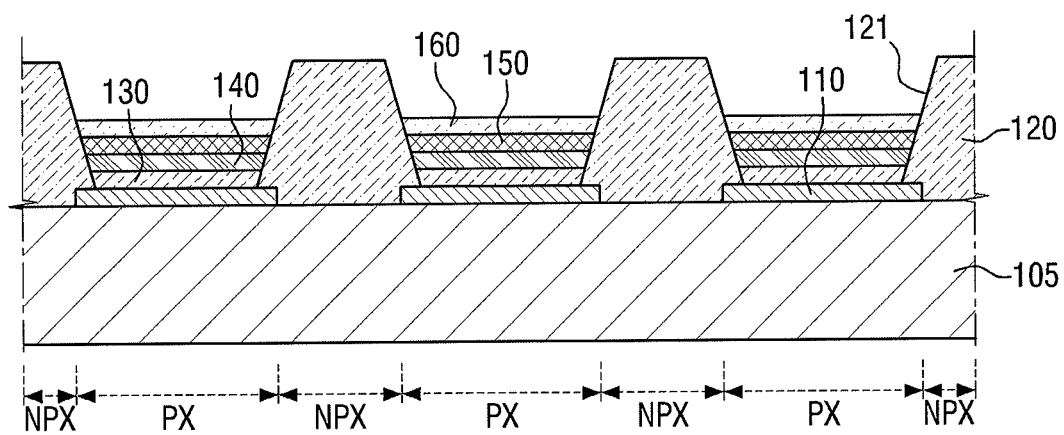

Referring to FIGS. 11 and 12, a light-emitting layer 160 may be formed on the hole transport layer 150.

Referring to FIG. 11, a light-emitting solution 160a may be ejected from an ejection device 40 into each of the pixel openings 121 of the pixel defining layer 120 using a printing method such as an inkjet printing method and then dried, and the light-emitting layer 160 may be formed on the hole transport layer 150 inside each of the pixel openings 121 of the pixel defining layer 120, as illustrated in FIG. 12. In some embodiments, the light-emitting solution 160a may be ejected from the ejection device 40 into each of the pixel openings 121 of the pixel defining layer 120 using a nozzle printing method.

The light-emitting layer 160 may include a red light-emitting layer which may emit red light, a green light-emitting layer which may emit green light, and a blue light-emitting layer which may emit blue light.

The red light-emitting layer may include one red light-emitting material or a host and a red dopant. Examples of the host of the red light-emitting layer may include, for example, tris(8-hydroxyquinolinato)aluminium ($Alq_3$), 4,4'-N,N'-dicarbazol-biphenyl (CBP), ploy(n-vinylcarbazole) (PVK), 9,10-Di(naphthyl-2-yl)anthracene (ADN), 4,4',4"-tris(N-carbazolyl)triphenylamine (TCTA), 1,3,5-tris(N-phenylbenzimidazole-2-yl)benzene (TPBI), 3-tert-butyl-9,10-di(naphth-2-yl) anthracene (TBADN), ter-fluorene (E3), and distyrylarylene (DSA). Examples of the red dopant may include, for example, PtOEP, $Ir(piq)_3$, and $Btp_2Ir(acac)$.

The green light-emitting layer may include one green light-emitting material or a host and a green dopant. The host of the red light-emitting layer may be used as the host of the green light-emitting layer. Examples of the green dopant may include, for example, $Ir(ppy)_3$, $Ir(ppy)_2(acac)$, and $Ir(mpyp)_3$.

The blue light-emitting layer may include one blue light-emitting material or a host and a blue dopant. The host of the red light-emitting layer may be used as the host of the blue light-emitting layer. Examples of the blue dopant may include, for example, $F_2Irpic$, $(F_2ppy)_2Ir(tmd)$, $Ir(dfppz)_3$, ter-fluorene (E3), 4,4'-bis(4-di-p-tolylaminostyryl) biphenyl (DPAVBi), and 2,5,8,11-tetra-tert-butyl perylene (TBPe).

Referring to FIG. 13, an electron transport layer 170, an electron injection layer 180, and the second electrode 190 may be formed on the light-emitting layer 160. The electron transport layer 170, the electron injection layer 180 and the second electrode 190 may be formed successively using a deposition method.

The electron transport layer 170 may be made of an organic compound such as, for example, 4,7-diphenyl-1,10-phenanthroline (Bphen), aluminum(III)bis(2-methyl-8-hydroxyquinolinato)4-phenylphenolate (BAlq), tris(8-quinolinato)aluminum (Alq3), berylliumbis(benzoquinolin-10-olate) ($Bebq_2$), or 1,3,5-tris(N-phenylbenzimidazole-2-yl) benzene (TPBI).

The electron injection layer 180 may be made of, for example, LiF or CsF.

The second electrode 190 may include a conductive material having a relatively lower work function than the first electrode 110. For example, the second electrode 150 may include Li, Ca, LiF/Ca, LiF/Al, Al, Mg, Ag, Pt, Pd, Ni, Au, Nd, Ir, Cr, BaF, Ba, or any mixture or compound (e.g., a compound of Ag and Mg) thereof. The second electrode 190 may further include an auxiliary electrode. The auxiliary electrode may include a layer formed by depositing at least one of the above materials and transparent metal oxide (such as ITO, IZO, ZnO, or indium tin zinc oxide (ITZO)) formed on the layer.

If the light-emitting display device 100 is of a bottom emission type, the second electrode 190 may include only a conductive layer having a low work function or may further include a reflective material layer formed on the conductive layer. If the light-emitting display device 100 is of a top emission type, the second electrode 190 may further include a transparent conductive layer (such as an ITO layer, an IZO layer, a ZnO layer, or an $In_2O_3$ layer) formed on the thin conductive layer.

The method of manufacturing a light-emitting display device according to the current embodiment may further include placing an encapsulation substrate on the second electrode 190. The method of manufacturing a light-emitting display device according to the current embodiment may further include placing a spacer between the second electrode 190 and the encapsulation substrate. Since various methods of placing the encapsulation substrate and placing the spacer may be readily determined by those of skill in the art, a detailed description thereof is omitted.

As described above, in the method of manufacturing a light-emitting display device according to the current embodiment, the lyophilic material layer 140a whose portion in contact with the hole injection layer 130 may react to light may be placed on the hole injection layer 130, an exposure process may then be performed using the unpatterned open mask OM, and the lyophilic layer 140 may be formed in each of the pixel openings 121 of the pixel defining layer 120. Therefore, the open mask OM may be reused even if the model of a light-emitting display device is changed, and the entire process may be simplified.

A light-emitting display device 100 manufactured using the manufacturing method of FIGS. 1 through 13 may include a substrate 105, a first electrode 110, a pixel defining layer 120, a hole injection layer 130, a lyophilic layer 140, a hole transport layer 150, a light-emitting layer 160, an electron transport layer 170, an electron injection layer 180, and a second electrode 190.

Since the substrate 105 has been described above in detail, a redundant description thereof is omitted.

The first electrode 110 may be disposed on the substrate 105 in each pixel region PX. The first electrode 110 may be an anode that may provide holes to the light-emitting layer 160 in response to a signal transmitted to a drain electrode of a TFT disposed on the substrate 105.

The pixel defining layer 120 may be formed on the substrate 105 to define each pixel region PX and may have a plurality of pixel openings 121, each exposing the first electrode 110. The pixel defining layer 120 may allow the hole injection layer 130 to be formed on the first electrode 110 through each of the pixel openings 121.

The hole injection layer 130 may be disposed on the first electrode 110 inside each of the pixel openings 121 of the pixel defining layer 120. The hole injection layer 130 may be a buffer layer that may lower an energy barrier between the first electrode 110 and the hole transport layer 150. The hole injection layer 130 may allow holes received from the first electrode 110 to be easily injected into the hole transport layer 150.

The lyophilic layer 140 may be formed on the hole injection layer 130 inside each of the pixel openings 121 of the pixel defining layer 120 to completely overlap the hole injection layer 130. The lyophilic layer 140 may be formed in the same pattern as the hole injection layer 130. The lyophilic layer 140 may increase the wettability of a hole transport solution 150a (see FIG. 9) for the lyophilic layer 140, such that the hole transport layer 150 may be uniformly formed inside each of the pixel openings 121 of the pixel defining layer 120.

The hole transport layer 150 may be disposed on the lyophilic layer 140 inside each of the pixel openings 121 of the pixel defining layer 120. The hole transport layer 150 may deliver holes received through the hole injection layer 130 to the light-emitting layer 160.

The light-emitting layer 160 may be disposed on the hole transport layer 150 inside each of the pixel openings 121 of the pixel defining layer 120. The light-emitting layer 160 may emit light when holes received from the first electrode 110 and electrons received from the second electrode 190 recombine. For example, holes and electrons provided to the light-emitting layer 160 may combine to form excitons. When the excitons change from an excited state to a ground state, the light-emitting layer 160 may emit light.

The electron transport layer 170 may be disposed on the light-emitting layer 160. The electron transport layer 170 may deliver electrons received from the second electrode 190 via the electron injection layer 180 to the light-emitting layer 160.

The electron injection layer 180 may be disposed on the electron transport layer 170. The electron injection layer 180 may be a buffer layer that may lower an energy barrier between the electron transport layer 170 and the second electrode 190. The electron injection layer 180 may allow electrons received from the second electrode 190 to be easily injected into the electron transport layer 170.

The second electrode 190 may be disposed on the electron injection layer 180 and may be a cathode that may provide electrons to the light-emitting layer 160.

A method of manufacturing a light-emitting display device according to an embodiment will now be described.

FIGS. 14 through 17 illustrate cross-sectional views of the operation of forming a lyophilic layer 140 in a method of manufacturing a light-emitting display device according to an embodiment.

The method of manufacturing a light-emitting display device according to the current embodiment is the same as the method of manufacturing a light-emitting display device according to the embodiment of FIGS. 1 through 13 except for the operation of forming the lyophilic layer 140. Accordingly, the method of manufacturing a light-emitting display device according to the current embodiment will be described, focusing mainly on the operation of forming the lyophilic layer 140.

Referring to FIGS. 14 through 17, the lyophilic layer 140 may be formed on a first electrode 110 using an open mask OM.

Figure 14:
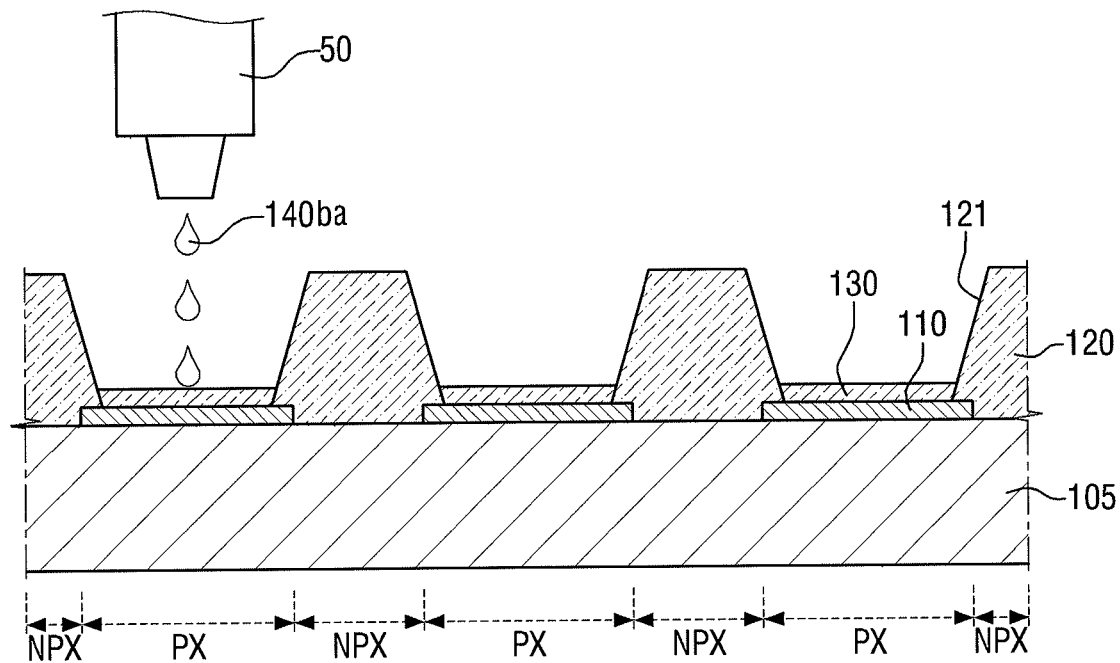
FIGS. 14 through 17 illustrate cross-sectional views of the operation of forming a lyophilic layer in a method of manufacturing a light-emitting display device according to an embodiment.
Figure 15:
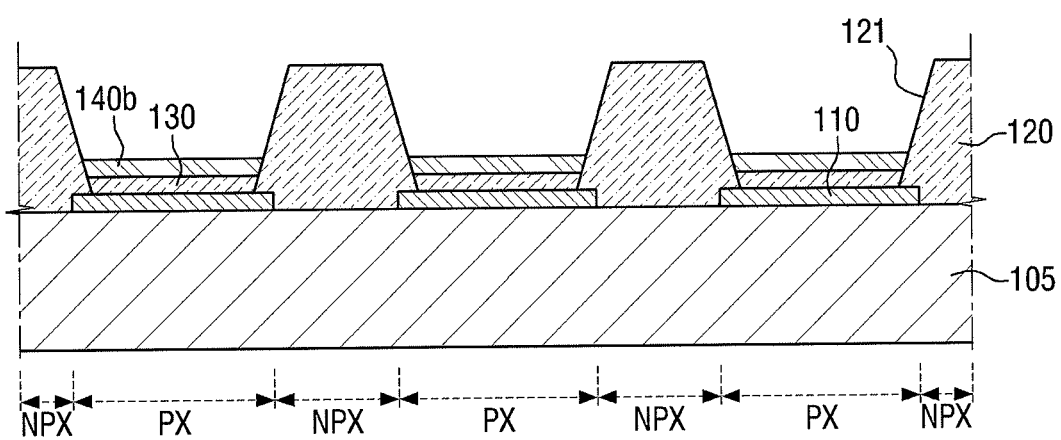

Referring to FIG. 14, a lyophilic solution 140ba may be ejected from an ejection device 50 into each pixel opening 121 of a pixel defining layer 120 using a printing method such as an inkjet printing method and then dried, and a lyophilic material layer 140b may be disposed only on the first electrode 110 as illustrated in FIG. 15. For example, the whole, e.g., an entirety, of the lyophilic material layer 140b may contact a hole injection layer 130. The lyophilic material layer 140b may be made of the same material as the lyophilic material layer 140a of FIG. 5.

Figure 16:
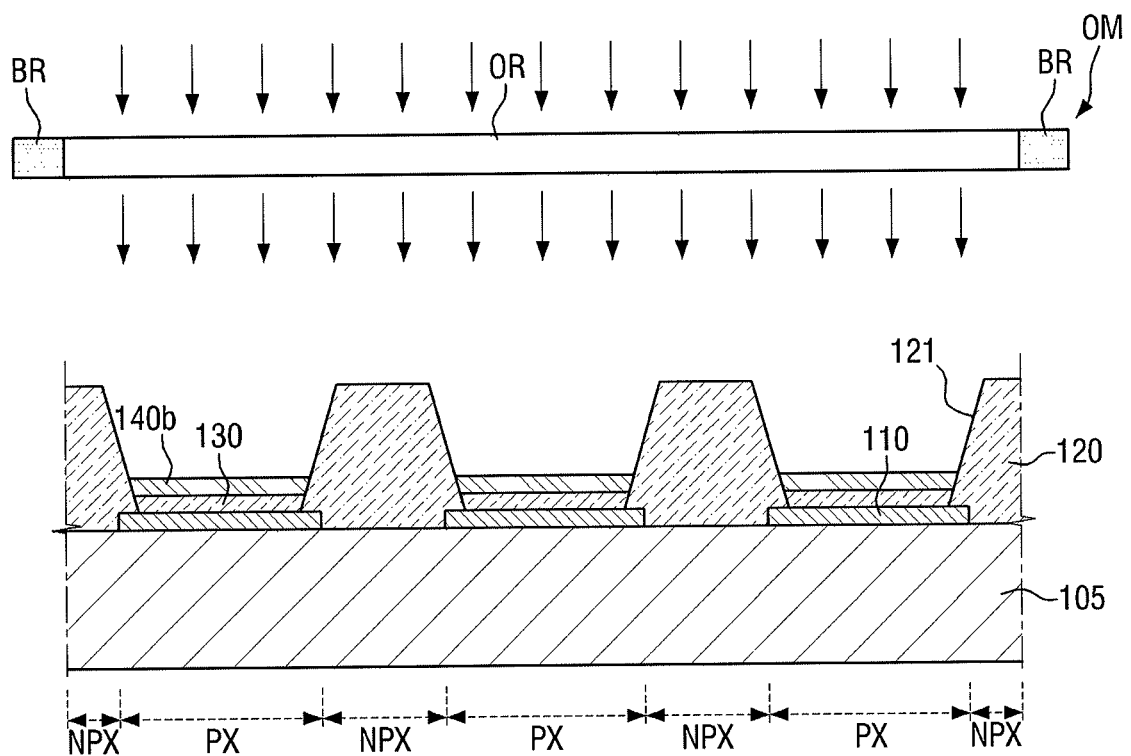

Referring to FIG. 16, the open mask OM may be placed above the pixel defining layer 120 to face the pixel defining layer 120, and then light may be irradiated to the lyophilic material layer 140b. In FIG. 16, arrows indicate light irradiated and passing through the open mask OM.

Figure 17:
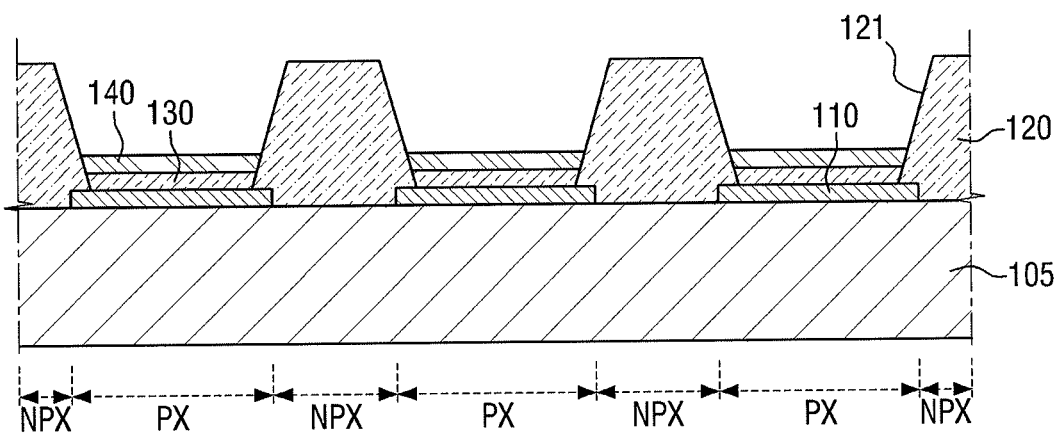

The open mask OM may be placed above the pixel defining layer 120 such that an opening region OR of the open mask OM may overlap pixel regions PX and a non-pixel region NPX, light may be irradiated to the lyophilic material layer 140a, and the lyophilic material layer 140a may be exposed to the light. The lyophilic material layer 140b may react to the light and may be cured. Accordingly, the lyophilic layer 140 may be formed on the hole injection layer 130 to completely overlap the hole injection layer 130, as illustrated in FIG. 17. The open mask OM may be used to prevent the light irradiated to the lyophilic material layer 140a from leaking to unnecessary regions.

As described above, the lyophilic material layer 140b may be formed only on the hole injection layer 130 using a printing method, and the lyophilic layer 140 may be formed inside each pixel opening 121 of the pixel defining layer 120 without the process of spraying the developing solution 20a in FIG. 7.

In the method of manufacturing a light-emitting display device according to the current embodiment, the lyophilic material layer 140b may be placed only on the hole injection layer 130, an exposure process may then be performed using the unpatterned open mask OM, and the lyophilic layer 140 may be formed inside each pixel opening 121 of the pixel defining layer 120. Therefore, the open mask OM may be reused even if the model of a light-emitting display device is changed, and the entire process may be simplified.

By way of summation and review, an organic light-emitting display device may include a pixel defining layer having an opening that exposes the anode formed in each of a plurality of pixel regions. The hole injection layer, the hole transport layer, the light-emitting layer, the electron transport layer, the electron injection layer, and the cathode may be formed on the anode exposed through the opening of the pixel defining layer. For example, the hole transport layer and the organic light-emitting layer may be formed using an inkjet printing method or a nozzle printing method.

A lyophilic layer having lyophilic properties may be formed on the anode to improve wettability of a hole transport solution. The lyophilic layer may be formed by a photolithography process using a pattern mask that may include a plurality of light-transmitting portions (e.g., a plurality of openings) corresponding to the pixel regions.

However, when the model of the light-emitting display device is changed, pattern masks may need to be changed.

A new pattern mask may need to be manufactured, which may not only be cumbersome but may also increase costs. In addition, it may not be easy to manage pattern masks. Moreover, additional processes may be required for the replacement of pattern masks.

Provided is a method of manufacturing a light-emitting display device that may be capable of simplifying the entire process by not requiring a change of masks when a model of a light-emitting display device is changed. Provided is a light-emitting display device manufactured using a method of manufacturing a light-emitting display device that may be capable of simplifying the entire process by not requiring a change of masks for each model.

In a method of manufacturing a light-emitting display device according to an embodiment, a lyophilic material layer whose portion in contact with a hole injection layer may react to light may be placed on the hole injection layer, and a lyophilic layer may be formed in each pixel opening of a pixel defining layer by performing an exposure process using an unpatterned open mask. Therefore, when a model of a light-emitting display device is changed, the open mask may be reused, and the entire process may be simplified.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A light-emitting display device, comprising:
   a substrate including a plurality of pixel regions divided by a non-pixel region;
   a first electrode on the substrate in each of the pixel regions;
   a pixel defining layer on the substrate and including a plurality of pixel openings, each of the pixel openings exposing the first electrode;
   a hole injection layer on the first electrode in each of the pixel openings;
   a lyophilic layer on an upper surface of the hole injection layer, the lyophilic layer overlapping the hole injection layer and including a material whose portion in contact with the hole injection layer reacts to light;
   a hole transport layer on the lyophilic layer;
   a light-emitting layer on the hole transport layer; and
   a second electrode on the light-emitting layer,
   wherein an entirety of the upper surface of the hole injection layer directly contacts the lyophilic layer, and
   wherein the hole injection layer does not include any portion that does not overlap the hole transport layer.

2. The light-emitting display device as claimed in claim 1, wherein a cured lyophilic layer forms a gel structure, wherein a contact angle between the hole transport layer the and cured lyophilic layer is 20 degrees or less, and wherein the lyophilic layer is in each of the pixel openings.

3. The light-emitting display device as claimed in claim 1, wherein the lyophilic layer is formed in a same pattern as the hole injection layer.

4. The light-emitting display device as claimed in claim 1, wherein the lyophilic layer includes one or more of olefin, acrylate, methacrylate, vinyl ether, quinone, benzophenone, benzoin ether, aryl ketone, peroxide, biimidazole, benzyl dimethyl ketal, hydroxyl alkyl phenyl acetophone, dialkoxy actophenone, trimethylbenzoyl phosphine oxide derivatives, aminoketone, benzoyl cyclohexanol, methyl thiophenyl morpholino ketone, morpholino phenyl amino ketone, alpha halogeno acetophenone, oxysulfonyl ketone, sulfonyl ketone, oxysulfonyl ketone, sulfonyl ketone, benzoyl oxime ester, thioxanthone, camphorquinone, ketocoumarin, or Michler's ketone.

5. The light-emitting display device as claimed in claim 4, wherein the hole injection layer includes one or more of 4,4',4"-tris(3-methylphenylphenylamino) triphenylamine (MTDATA), copper phthalocyanine (CuPc), polyaniline (PAM), or poly(3,4-ethylenedioxythiophene)/polystyrene sulfonate (PEDOT/PSS).

6. The light-emitting display device as claimed in claim 1, wherein the pixel defining layer includes an insulating material that contains fluorine.

7. The light-emitting display device as claimed in claim 1, further comprising one or more of an electron transport layer or an electron injection layer between the light-emitting layer and the second electrode.

* * * * *